United States Patent [19]

Nagano

[11] 4,412,186

[45] Oct. 25, 1983

[54] CURRENT MIRROR CIRCUIT
[75] Inventor: Katsumi Nagano, Hiratsuka, Japan
[73] Assignee: Tokyo Shibaura Denki Kabushiki Kaisha, Kawasaki, Japan
[21] Appl. No.: 251,338
[22] Filed: Apr. 6, 1981
[30] Foreign Application Priority Data Apr. 14, 1980 [JP] Japan ................................ 55-49021

[51] Int. Cl.³ ............................................. H03F 3/04
[52] U.S. Cl. ..................................... 330/288; 323/316
[58] Field of Search ................. 330/288; 323/315, 316

[56] References Cited
U.S. PATENT DOCUMENTS 3,936,725 2/1976 Schneider ...................... 330/288 X
4,166,971 9/1979 Schneider ...................... 330/288 X

OTHER PUBLICATIONS

Radovsky, "Current-Mirror Amplifiers Having Current Gains Less Influenced by the Base Currents of Component Transistors," *RCA Technical Notes*, TN No. 949, Dec. 31, 1973.
Wilson, G. R., "A Monolithic Junction FET-n-p-n Operational Amplifier," IEEE Journal of Solid-State Circuits, vol. SC-3, No. 4, 1968.
Frederiksen, T. M., et al., "A New Current-Differencing Single-Supply Operational Amplifier," IEEE Journal of Solid-State Circuits, vol. SC-6, No. 6, 1971.
Hart, B. L., et al., "D.C. Matching Errors in the Wilson Current Source, "Electronics Letters, vol. 12, No. 15, pp. 389-390, 1976.

*Primary Examiner*—James B. Mullins
*Attorney, Agent, or Firm*—Finnegan, Henderson, Farabow, Garrett & Dunner

[57] ABSTRACT

A current mirror circuit having high accuracy in its current mirror transfer ratio λ even when constructed of P-N-P transistors. The circuit includes two stages each having three transistors of one conductivity type and a fourth transistor of a different conductivity type. Two of the like transistors of each stage have a common base electrode and the third like transistor is connected between the common electrode and a reference potential. The fourth transistor of each stage has its base connected to an individual one of the collectors of the base-connected transistors and its emitter connected both to a current source and the base of the third like transistor. The emitters of the base-connected transistors of the first stage and the collectors of the fourth transistors of each stage are connected to a power supply. The emitters of the base-connected transistors of the second stage are connected to the collectors of the base-connected transistors of the first stage. The collector of one of the base-connected transistors of the second stage is connected to a current source as an input and the collector of the other base-connected transistor of the second stage is connected to a load as the output.

2 Claims, 5 Drawing Figures

CURRENT MIRROR CIRCUIT

BACKGROUND OF THE INVENTION

This invention relates to a current mirror circuit, and more particularly to a current mirror circuit which has high accuracy in its current mirror transfer ratio even when constructed of P-N-P transistors.

To obtain an output current matched to the input current, a current mirror circuit is often used. The improved Wilson current source which is a conventional circuit for use as a current mirror circuit is well-known.

FIG. 1 shows the equivalent circuit of the improved Wilson current source. As shown in FIG. 1, the current source comprises four matched monolithic bipolar transistors Q1, Q2, Q3 and Q4. The base electrodes of the matched transistors Q1 and Q2 are connected in common, and the collector electrode of the transistor Q1 is connected to the commonly connected base electrodes, and also connected to the input current source 1.

The collector electrode of transistor Q2 is connected to the load 2, and provides the output current Io. The emitter electrodes of transistor Q1 and Q2 are connected to the collector electrodes of matched transistors Q3 and Q4, respectively. The base electrodes of transistors Q3 and Q4 are connected in common, and the common base electrode is connected to the collector electrode of transistor Q4. The emitter electrodes of transistors Q3 and Q4 are connected to a first power supply terminal 3, and the input current source and the load 2 are connected to a second power supply terminal 4.

This current source has the advantage that, when the four transistors are matched, the collector-emitter voltages $V_{CE}$ of transistors Q3 and Q4 are equivalent to their base-emitter voltages $V_{BE}$. Therefore the relationship between the collector current of transistors Q3 and Q4 is free from the Early effect (the phenomenon that the collector current varies approximately linearly with collector-emitter voltage for fixed base current).

So the current mirror transfer ratio of this source is very good. The current mirror transfer ratio $\lambda$ of this source is given by $$\lambda = \frac{Io}{Ii} = \frac{1}{1 + \frac{2}{\beta(\beta + 2)}} = 1 - \frac{2}{\beta^2} \quad (1)$$

(only $\beta > 1$)

wherein

Ii: input current, namely the collector current of transistor Q1,

Io: output current, namely the collector current of transistor Q2, $\beta$: common emitter current gain.

In this equation, the second term of the right side shows the error, and the value of the error is inversely proportional to the square of the $\beta$. The $\beta$ of an NPN transistor is high, but the $\beta$ of a PNP transistor is much smaller than the $\beta$ of NPN transistors, usually a tenth of the $\beta$ of NPN transistors. Therefore, when this current source is constructed of PNP transistors, the error value is large, and a well-matched output current to input current is not expected.

FIG. 2 shows another conventional current mirror circuit which is constructed using PNP transistors. In this circuit, the base electrodes of matched PNP transistors Q5 and Q6 are connected in common, and their respective emitter electrodes are connected in common to terminal 7, and the collector electrode of transistor Q6 is connected to a first power supply terminal 9 through load 8, and carries the output current Io. The emitter electrode of the PNP transistor Q7 is connected to the common base electrodes of transistors Q5 and Q6, the base electrode of transistor Q7 is connected to the collector electrode of transistor Q5, and the collector electrode is connected to a second power supply terminal 6. In this circuit, when the base current of transistor Q7 is negligible (but as mentioned above the $\beta$ of the PNP transistor is not large, and the base current is not usually negligible) the output current Io is equal to the input current Ii.

But in this circuit, the collector-emitter voltage of the transistor Q6 is not fixed. Namely, when the voltage of the output terminal 9 is varied, the collector-emitter voltage $V_{CE}$ of transistor Q6 is also varied. So, by the Early effect (above-mentioned), the collector current of the transistor Q6 is varied. Therefore the relationship between the input current Ii and the output current Io is variable. So high accuracy is not expected.

Accordingly, it is an object of this invention to provide a current mirror circuit which has a good current mirror transfer ratio even if constructed using PNP transistors. Another object of this invention is to provide a current mirror circuit which is free from the Early effect.

These and other objects of this invention will become apparent to one skilled in the art with a reading and understanding of the following description of the invention and claims.

SUMMARY OF THE INVENTION

The circuit comprises two basic stages each including three transistors. In the first stage, the base electrodes of the first and second matched transistors are connected in common, and their respective emitter electrodes are connected to the first power supply terminal. The third matched transistor has an emitter electrode connected to the common base electrode, and a base electrode connected to the collector electrode of the second transistor. In the second stage, the base electrodes of the fourth and fifth matched transistors are connected in common, and their respective collector electrodes are connected to a current source and load, respectively. The sixth matched transistor has an emitter electrode connected to the common base electrodes of said fourth and fifth matched transistors, and a base electrode connected to the collector electrode of said fourth matched transistor. The collector electrodes of said third and sixth transistors are connected to a reference voltage such as second and third power supply terminals, respectively.

DETAILED DESCRIPTION OF THE PREFERRED EMBODIMENT

Figure 1:
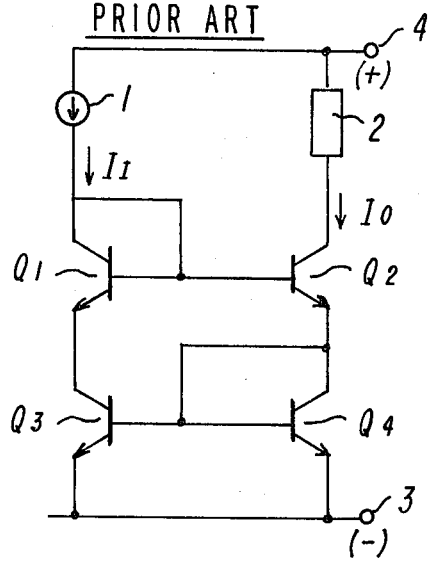
FIG. 1 is a schematic diagram of a prior art current mirror circuit.
Figure 2:
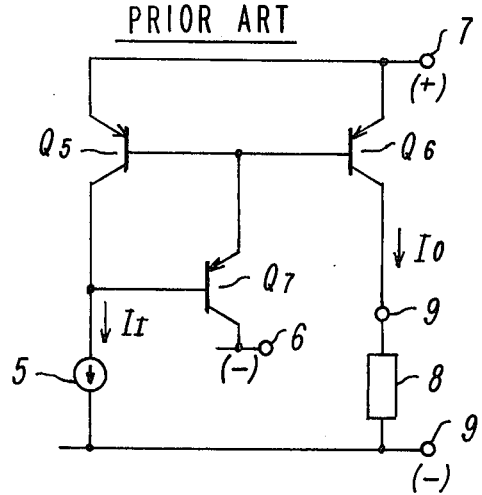
FIG. 2 is a schematic diagram of another prior art current mirror circuit.
Figure 3:
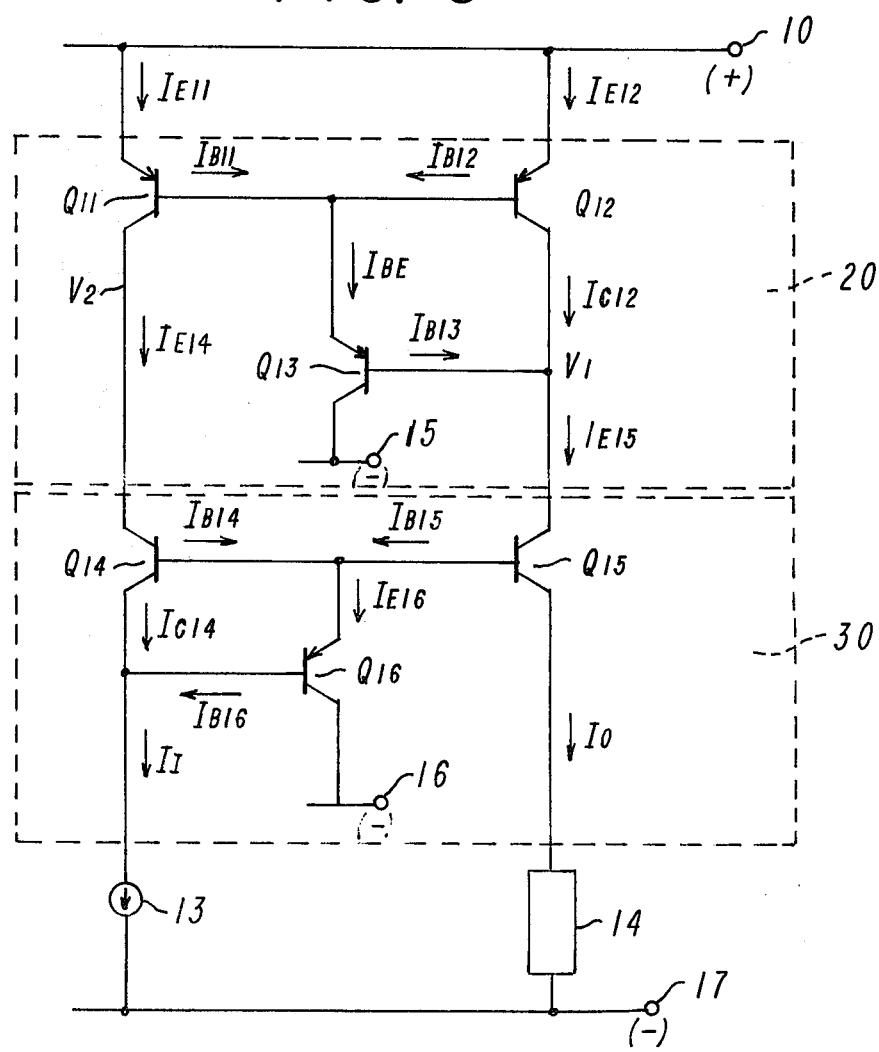
FIG. 3 is a simple current mirror circuit employing the principle of this invention.

Referring to FIG. 3 it is preferred that the current mirror circuit of this invention have first and second stages 20, 30. As here embodied the first stage includes first, second and third matched PNP transistors Q11, Q12 and Q13, and the second stage includes fourth, fifth and sixth matched PNP transistors Q14, Q15 and Q16.

In the first stage 20, the emitter electrodes of the first and second matched PNP transistors Q11, Q12 are respectively connected to the first power supply terminal 10. The base electrodes of Q11 and Q12 are connected in common. The emitter electrode of the third matched PNP and transistor Q13 is connected to the common base electrodes of transistors Q11 and Q12. The third matched PNP transistor Q13 has a base electrode connected to the collector electrode of the transistor Q12. The collector electrode of the transistor Q13 is connected to the second power supply terminal 15.

In the second stage 30 of the current mirror circuit, referring still to the embodiment of FIG. 3, the emitter electrodes of the fourth and fifth matched PNP transistors Q14 and Q15 are connected to the collector electrodes of transistors Q11 and Q12, respectively. The base electrodes of the transistors Q14 and Q15 are connected in common. The sixth matched PNP transistor Q16 has an emitter electrode connected to the commonly connected base electrodes of the transistors Q14 and Q15, and a base electrode connected to the collector electrode of transistor Q14. The collector electrode of transistor Q16 is connected to the third power supply terminal 16. It is preferable to set the potential level of said second and third power supply terminals 15, 16 equal, for example as shown here at ground potential. And the respective collector electrodes of the transistors Q14 and Q15 are connected to a fourth supply terminal 17 through a current source 13 and a load 14 respectively.

When transistors Q11 and Q16 are matched and the emitter electrodes of transistors Q11 and Q12 are connected to the first power supply terminal 10, the emitter-base junction voltage of transistors Q11 and Q12 will be identical. So the emitter currents $I_{E11}$ and $I_{E12}$ of transistors Q11 and Q12 are identical, and equal to IE. It follows that the collector currents of transistors Q11 and Q12 are identical. So $$I_{C11} = I_{C12} = \alpha \cdot I_E \quad (2)$$

and also the base current of the transistors, $I_{B11}$ and $I_{B12}$, are $$I_{B11} = I_{B12} = \alpha/\beta \cdot I_E \quad (3)$$

wherein $\alpha$ is base common current gain and $\beta$ is emitter common current gain, and $$\alpha = \frac{\beta}{\beta + 1} \quad (4)$$

So the emitter current of transistor Q13 is $$I_{BE} = \frac{\alpha}{\beta} I_E + \frac{\alpha}{\beta} I_E = \frac{2\alpha}{\beta} \cdot I_E \quad (5)$$

and the base current $I_{B13}$ is $$I_{B13} = \frac{2\alpha^2}{\beta^2} \cdot I_E \quad (6)$$

This base current $I_{B13}$ is added to the collector current $I_{C12}$ of transistor Q12. So the emitter current $I_{E15}$ of transistor Q15 is $$I_{E15} = \frac{2\alpha^2}{\beta^2} \cdot I_E + \alpha \cdot I_E \quad (7)$$

on the other hand, the emitter current of transistor Q14 is $$I_{E14} = \alpha \cdot I_E \quad (8)$$

therefore, the base current of transistors Q14 and Q15 is $$I_{B14} = \frac{\alpha^2}{\beta} \cdot I_E \quad (9)$$

$$I_{B15} = \frac{\alpha^2}{\beta}\left(1 + \frac{2\alpha}{\beta^2}\right) \cdot I_E \quad (10)$$

and so, the emitter current $I_{E16}$ of the transistor Q16 is $$I_{E16} = \frac{\alpha^2}{\beta} \cdot I_E + \frac{\alpha^2}{\beta}\left(1 + \frac{2\alpha}{\beta^2}\right) \cdot I_E \quad (11)$$

$$= \frac{2\alpha^2}{\beta}\left(1 + \frac{\alpha}{\beta^2}\right) \cdot I_E$$

therefore, the base current $I_{B16}$ is $$I_{B16} = \frac{2\alpha^3}{\beta^2}\left(1 + \frac{\alpha}{\beta^2}\right) \cdot I_E \quad (12)$$

this base current $I_{B16}$ is added to the collector current of transistor Q14. So the input current $I_i$ is $$I_i = I_{C14} + I_{B16} \quad (13)$$

$$= \left\{\alpha^2 + \frac{2\alpha^3}{\beta^2}\left(1 + \frac{\alpha}{\beta^2}\right)\right\} I_E$$

and the output current Io, namely the collector current of transistor Q15 is $$I_o = \alpha \cdot I_{E15} = \alpha^2\left(1 + \frac{2\alpha}{\beta^2}\right) \cdot I_E \quad (14)$$

So the current mirror transfer ratio $\lambda(=I_o/I_i)$ is $$\lambda = \frac{\alpha^2 \left(1 + \frac{2\alpha}{\beta^2}\right) I_E}{\left\{\alpha^2 + \frac{2\alpha^3}{\beta^2}\left(1 + \frac{\alpha}{\beta^2}\right)\right\} I_E} \quad (15)$$

when $$\left(\frac{\beta}{\beta+1}\right)$$

is substituted for $\alpha$, the current mirror transfer ratio $\lambda$ is $$\lambda = \frac{Io}{Ii} = \frac{1}{1 + \frac{2}{\frac{\beta^2(\beta+1)^2}{1 + \frac{2}{\beta(\beta+1)}}}} \quad (16)$$

and when $\beta$ is much larger than one, $$\frac{2}{\beta(\beta+1)}$$

is much smaller than 1. So, the above equation can be expressed as follows approximately.

$$\lambda \approx 1 - \frac{2}{\beta^4} \quad (17)$$

In this equation, the second term of the right side shows the variance from the ideal unity transfer ratio.

It is apparent from a comparison of equations (1) and (17), that the error in the current mirror transfer ratio of this invention is much smaller in comparison with the conventional circuit. So even if this circuit is constructed using PNP transistors wherein $\beta$ is significantly smaller than the $\beta$ for the NPN transistors, the current mirror transfer ratio of this circuit will be closer to unity.

And in this circuit, the collector-emitter voltages of the transistors Q11 and Q12 are fixed at the same value. Namely, when the first power terminal 10 is at ground potential, the base potential V1 of transistor Q13 is $$V1 = -V_{BE12} - V_{BE13} = -2V_{BE} \quad (17)$$

So the collector-emitter voltage $V_{CE}$ of the transistor Q12 is $2V_{BE}$. And the collector potential level V2 of the transistor Q11 is $$V2 = V1 - V_{BE15} + V_{BE14} \quad (18)$$

So when $V_{BE14}$ is equal to $V_{BE15}$, $$V2 = V1 \quad (19)$$

Therefore, the collector-emitter voltage $V_{CE}$ of the transistor Q11 is also $2V_{BE}$. So, the collector-emitter voltages of the transistors Q11 and Q12 are fixed at the same value and the current mirror transfer ratio is not influenced by the Early effect.

Figure 4:
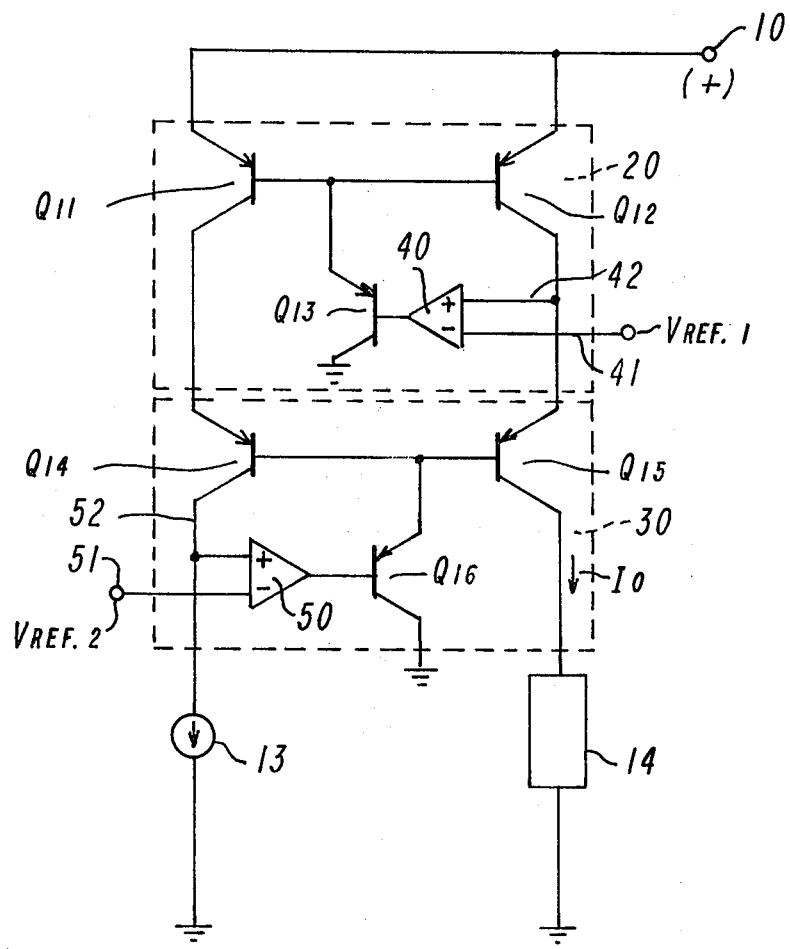
FIG. 4 is another embodiment according to this invention.

FIG. 4 shows another embodiment of this invention. In this embodiment, the third and sixth matched PNP transistors Q13 and Q16 have base signals applied through amplifiers 40 and 50, respectively. The amplifier 40 has an inverting input terminal 41 and a non-inverting input terminal 42. To the inverting input terminal 41, a first reference voltage $V_{ref1}$ is applied, and non-inverting input terminal 42 is connected to the collector electrode of transistor Q12.

The amplifier 50 has an inverting input terminal 51 and a non-inverting terminal 52. To the inverting input terminal 51, a second reference voltage $V_{ref2}$ is applied, and the non-inverting input terminal 52 is connected to the collector electrode of the transistor Q14.

In this embodiment, by changing the level of reference voltages at the first power supply terminal 10 the collector potential of Q12 can be varied. Namely, when the voltage level of the collector of transistor Q12 is higher than the reference voltage $V_{ref1}$, the output voltage of amplifier 40 becomes high, so the base voltage of transistor Q13 is increased. Then the potential level of the common base electrode of transistors Q11 and Q12 is also increased. So, the collector current of transistor Q12 is reduced. This feedback type action continues to lower the collector potential level of transistor Q12 to equal the reference voltage $V_{ref1}$. When the collector potential level of transistor Q12 is lower than the reference voltage $V_{ref1}$, the opposite action occurs to raise the collector potential level of transistor Q12 to the reference voltage $V_{ref1}$.

The above action also occurs between amplifier 50, the sixth matched transistor Q16 and the fourth matched transistor Q14. So, the collector potential level of transistor Q14 is fixed to the reference voltage $V_{ref2}$.

Figure 5:
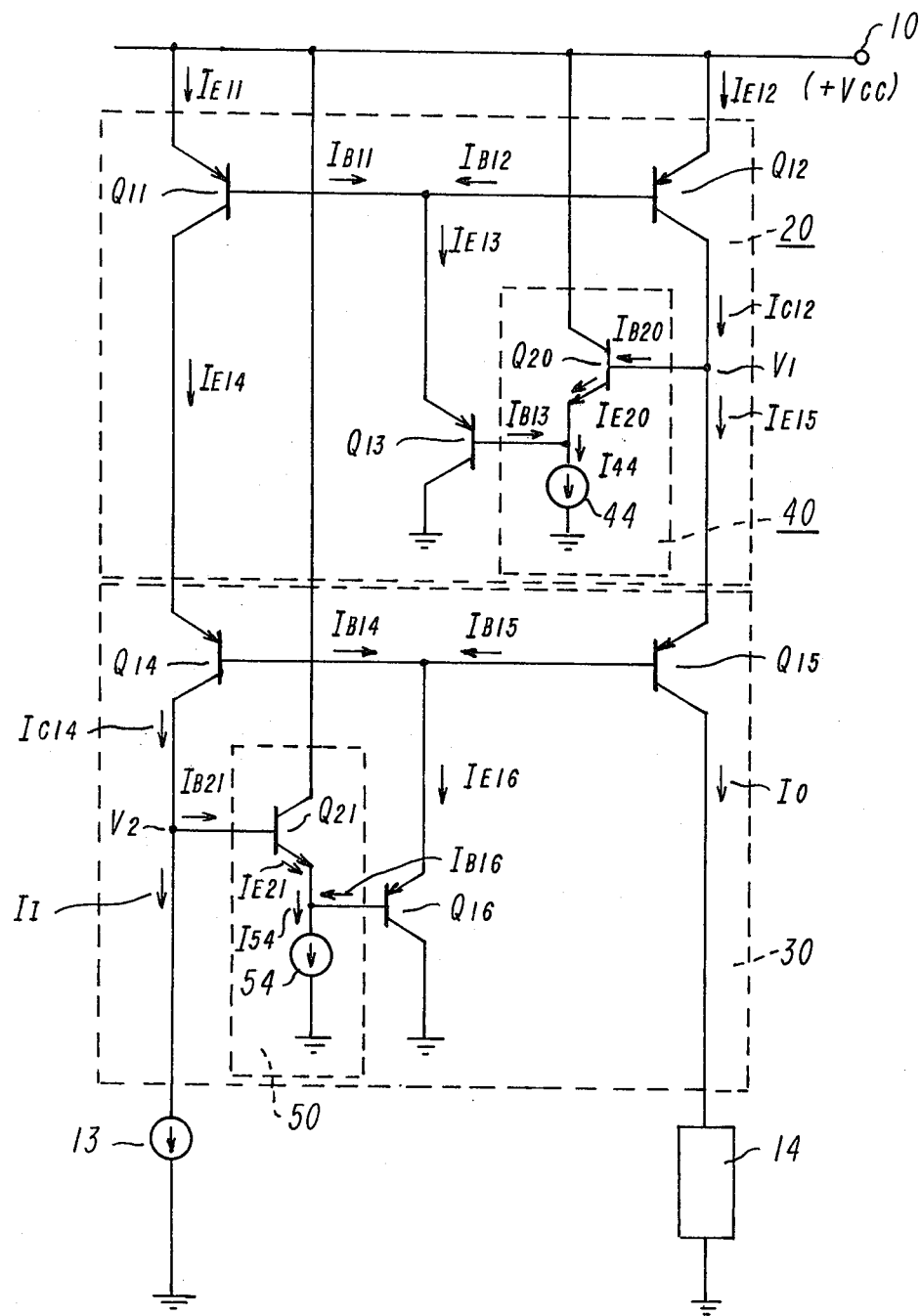
FIG. 5 is a simplified embodiment according to the principle of the circuit shown in FIG. 4.

FIG. 5 shows a simplified embodiment according to the circuit arrangement of FIG. 4. Namely, amplifier 40 comprises an NPN transistor Q20 and a constant current source 44. NPN transistor Q20 has an emitter connected to the base of the third matched PNP transistor Q13, a base connected to the collector of the second matched PNP transistor Q12, and a collector connected to the first power supply terminal 10. The constant current source 44 is connected between the emitter electrode of the transistor Q20 and ground.

Amplifier 50 comprises an NPN transistor Q21 and a constant current source 54. Transistor Q21 has an emitter connected to the base of the sixth matched NPN transistor Q16, a base connected to the collector of the fourth matched PNP transistor Q14 and a collector connected to the first power supply terminal 10. The constant current source 54 is connected between the emitter of the transistor Q21 and a reference potential.

In this embodiment, when the voltage at the first power supply terminal 10 is $+V_{CC}$, the collector voltage V1 of the transistor Q12 is $$V1 = V_{CC} - V_{BE12} - V_{BE13} + V_{BE20} \quad (20)$$

wherein $V_{BE12}$, $V_{BE13}$ and $V_{BE20}$ are base-emitter voltages of the transistors Q12, Q13 and Q20 respectively. So when $V_{BE12}$, $V_{BE13}$ and $V_{BE20}$ are equal to $V_{BE}$, V1 is:

$$V1 = V_{CC} - V_{BE} \quad (21).$$

In this situation, if the collector potential level of transistor Q12 increases, the base potential level of transistor Q13 also increases. So the emitter potential level of transistor Q13, namely the base potential level of the transistor Q12, also increases. Therefore the collector current of the transistor Q12 decreases, so the collector potential level of the transistor Q12 also decreases. Therefore V1 is fixed to the potential level shown by equation (21).

Amplifier 50 includes an NPN transistor Q21 and a constant current source 54. The collector potential V2 of the transistor Q14 can be expressed as follows:

$$V2 = V1 - V_{BE15} - V_{BE16} + V_{BE21} \quad (22)$$

wherein $V_{BE15}$, $V_{BE16}$, $V_{BE21}$ are base-emitter voltages of the transistors Q15, Q16 and Q21 respectively. So, when they are identical and equal to $V_{BE}$, V2 is:

$$V2 = V1 - V_{BE} = V_{CC} - 2V_{BE} \quad (23)$$

It is clear from the equation (23), that the voltage difference between the power supply terminal 10 and the collector voltage V2 of the transistor Q14 is one $2V_{BE}$. So the required voltage for $V_{CC}$ is $$V_{CC} = 2V_{BE} + V13 \quad (24)$$

wherein V13 is the voltage required for the current source 13. So this circuit is operative even if at low $V_{CC}$, namely the above described $V_{CC}$.

On the other hand in this circuit, the relationship between the input current Ii and the output current Io is as follows. When the respective emitter currents of the transistors Q11 and Q12, namely $I_{E11}$, $I_{E12}$ are identical and equal to $I_E$, $$I_{B11} = I_{B12} = \frac{\alpha}{\beta} \cdot I_E \quad (25)$$

So, the emitter current of transistor Q13 is $$I_{E13} = \frac{2\alpha}{\beta} \cdot I_E \quad (26)$$

and the base current $I_{B13}$ is $$I_{B13} = \frac{2\alpha^2}{\beta^2} \cdot I_E \quad (27)$$

When the base current of transistor Q20 is $I_{B20}$, $$I_{E20} = \frac{1}{1-\alpha_1} I_{B20} \quad (28)$$

wherein $\alpha_1$: common base current gain of NPN transistor. Therefore the value of current from the constant current source 44, is $$I44 = I_{B13} + I_{E20} = \frac{2\alpha^2}{\beta^2} \cdot I_E + \frac{I_{B20}}{1-\alpha_1} \quad (29)$$

and the emitter current of the transistor Q15 is $$I_{E15} = \alpha \cdot I_E - I_{B20} \quad (30)$$

Therefore, the collector current of transistor Q15, namely, the output current Io, is $$Io = \alpha \cdot I_{E15} = \alpha^2 \cdot I_E - \alpha \cdot I_{B20} \quad (31)$$

On the other hand the input current Ii is $$Ii = \alpha^2 \cdot I_E - I_{B21} \quad (32)$$

and the value of the constant current source 54, namely I54 is $$I54 = \frac{\alpha^3}{\beta^2}\left(2I_E - \frac{I_{B20}}{\alpha}\right) + \frac{I_{B21}}{1-\alpha_1} \quad (33)$$

So it is apparent from the equations (31) and (32), the condition of Ii=Io is $$\alpha \cdot I_{B20} = I_{B21} \quad (34)$$

and the equation (29) can be rewritten as follows:

$$I_{B20} = (1-\alpha_1)\left(I44 - \frac{2\alpha^2}{\beta^2} I_E\right) \quad (35)$$

Also the equation (33) can be rewritten by substituting equation (35) for $I_{B20}$, $$I_{B21} = \quad (36)$$

$$(1-\alpha_1)\left\{I54 - \frac{2\alpha^3\beta^2 + 2\alpha^4(1-\alpha)}{\beta^4} I_E + \frac{\alpha^2(1-\alpha)}{\beta^2} I44\right\}$$

So by considering the equations (34), (35) and (36), the condition of Ii=Io, $$\alpha \cdot I44\left\{1 - \frac{\alpha(1-\alpha)}{\beta^2}\right\} + \frac{2\alpha^4(1-\alpha)}{\beta^4} I_E = I54 \quad (37)$$

and substituting $$\left(\frac{\alpha}{1-\alpha}\right)$$

for $\beta$, and also $k \cdot I44$ for I44 the above equation (37) is expanded as follows, $$I44\{\alpha-(1-\alpha)^3 + 2 \cdot k \cdot (1-\alpha)^5\} = I54 \quad (38)$$

wherein $k > 1$. So approximately I54 is $$I54 \approx \alpha \cdot I44 \quad (39)$$

Therefore when the current value of the constant current sources 44 and 54 are set to meet the relationship of the equations (37), (38) or (39), the output current Io is identical to the input current Ii. Furthermore, it is possible to vary the current mirror transfer ratio. For example, resistors can be connected between the respective emitters of transistors Q11 and Q12 and the first power supply terminal 10. And when the values of the resistors are changed, the current mirror transfer ratio is varied.

Furthermore, when the emitter areas of transmitter Q11 and Q12 are varied, the current mirror transfer ratio λ is also varied. Also the six matched transistors may be NPN transistors rather than the PNP transistors shown.

While there has been described what is at present considered to be the preferred embodiment of the invention, it will be understood that various modifications may be made therein, and it is intended to cover in the appended claims all such modifications as fall within the true spirit and scope of the invention.

What is claimed is:

1. A current mirror circuit comprising:
   a power supply terminal;
   an input current source;
   an output across a load;
   a first stage including:
   first, second and third transistors of a first conductivity type, each having a base, a collector and an emitter electrode, said first and second transistors having their base electrodes connected in common and their emitter electrodes connected to said power supply terminal, and said third transistor having its emitter connected in common with said base electrodes of said first and second transistors and its collector electrode connected to a reference voltage;
   a fourth transistor of a second conductivity type, having a base electrode connected to said collector electrode of said second transistor, a collector electrode connected to said power supply terminal, and an emitter electrode connected to the base electrode of said third transistor;
   and a current source connected to said emitter electrode of said fourth transistor;
   a second stage including:
   fifth, sixth and seventh transistors of said first conductivity type, each having a base, a collector and an emitter electrode, said fifth and sixth transistors having their base electrodes connected in common and their emitter electrodes connected to the respective collector electrodes of said first and second transistors, the collector electrode of said fifth transistor being connected to said input current source, and the collector electrode of said sixth transistor being connected to said output, and said seventh transistor having its emitter electrode connected in common with the base electrodes of said fifth and sixth transistors and its collector electrode connected to said reference voltage;
   an eighth transistor of said second conductivity type having a base electrode connected to the collector electrode of said fifth transistor, a collector electrode connected to said power supply terminal, and an emitter electrode connected to the base electrode of said seventh transistor; and
   a current source connected to the emitter electrode of said seventh transistor.

2. The current mirror circuit of claim 1 wherein the transistors of the first conductivity type are of the PNP type.

* * * * *